United States Patent
Tang (10) Patent No.: US 8,547,694 B2
(45) Date of Patent: Oct. 1, 2013

(54) RACK-MOUNT SERVER SYSTEM

(75) Inventor: Xian-Xiu Tang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 128 days.

(21) Appl. No.: 13/340,687

(22) Filed: Dec. 30, 2011

(65) Prior Publication Data

US 2013/0155608 A1 Jun. 20, 2013

(30) Foreign Application Priority Data

Dec. 16, 2011 (CN) .......................... 2011 1 0423312

(51) Int. Cl.
*G06F 1/20* (2006.01)
*H05K 7/20* (2006.01)

(52) U.S. Cl.
USPC .............. 361/679.5; 361/679.48; 361/679.49; 361/679.51; 361/695; 361/716; 312/236; 454/184

(58) Field of Classification Search
USPC ............... 361/679.48–679.51, 694–695, 716; 312/223.2, 236; 454/184
See application file for complete search history.

(56) References Cited

U.S. PATENT DOCUMENTS

| | | | | |
|---|---|---|---|---|
| 4,648,007 A * | 3/1987 | Garner | ..... | 361/695 |
| 6,042,348 A * | 3/2000 | Aakalu et al. | ..... | 417/423.5 |
| 6,643,123 B2 * | 11/2003 | Hartel et al. | ..... | 361/678 |
| 6,991,533 B2 * | 1/2006 | Tsai et al. | ..... | 454/184 |
| 7,508,663 B2 * | 3/2009 | Coglitore | ..... | 361/695 |
| 7,535,709 B2 * | 5/2009 | Fan et al. | ..... | 361/695 |
| 7,800,902 B2 * | 9/2010 | Della Fiora et al. | ..... | 361/695 |
| 7,952,870 B1 * | 5/2011 | Zhou | ..... | 361/695 |
| 8,089,754 B2 * | 1/2012 | Peng et al. | ..... | 361/679.48 |
| 2005/0168942 A1 * | 8/2005 | Steinbrecher | ..... | 361/690 |
| 2009/0262499 A1 * | 10/2009 | Chou | ..... | 361/695 |
| 2012/0133255 A1 * | 5/2012 | Izuno et al. | ..... | 312/236 |
| 2012/0247750 A1 * | 10/2012 | Kobayashi et al. | ..... | 165/287 |
| 2013/0056090 A1 * | 3/2013 | Tang | ..... | 137/215 |
| 2013/0065501 A1 * | 3/2013 | Wang | ..... | 454/184 |

* cited by examiner

*Primary Examiner* — Robert J Hoffberg
(74) *Attorney, Agent, or Firm* — Altis & Wispro Law Group, Inc.

(57) ABSTRACT

A rack-mount server system includes a cabinet, a number of server units mounted in the cabinet, and a number of fan modules. Each fan module cools one or a group of server units. Each fan module includes a mounting bracket fixed to the cabinet, a number of fans attached to the mounting bracket, an air flap, and a control box to control the power supply to the fans. The mounting bracket defines an air passage dedicated to each fan, through which air from the fan is guided to the one or a group of server units. Each mounting bracket defines a cutout, through which the air passages of two neighboring fans communicate with each other. The air flap may be slid closed or slid open to redirect or gather a cooling airflow as required, depending on the distribution of server units within the cabinet.

8 Claims, 10 Drawing Sheets

RACK-MOUNT SERVER SYSTEM

BACKGROUND

1. Technical Field

The present disclosure relates to a rack-mount server system.

2. Description of Related Art

A rack-mount server system includes a cabinet, a plurality of server units slidably mounted to the cabinet, and a fan module for heat dissipation from the server units. A fan module provides cooling for the cabinet mounted with a full set of the server units. However, when one or more server units are removed from the cabinet, the original cooling capacity of the fan module may become excessive, and unnecessary amount of power may be consumed by the fan module. Further, when one or more server units are removed from the cabinet, there are empty mounting spaces left in the cabinet and some cooling air generated by the fan module may flow through the mounting spaces without performing any heat-exchange for the remaining server units mounted in the cabinet.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION OF THE DESCRIPTION

Figure 1:
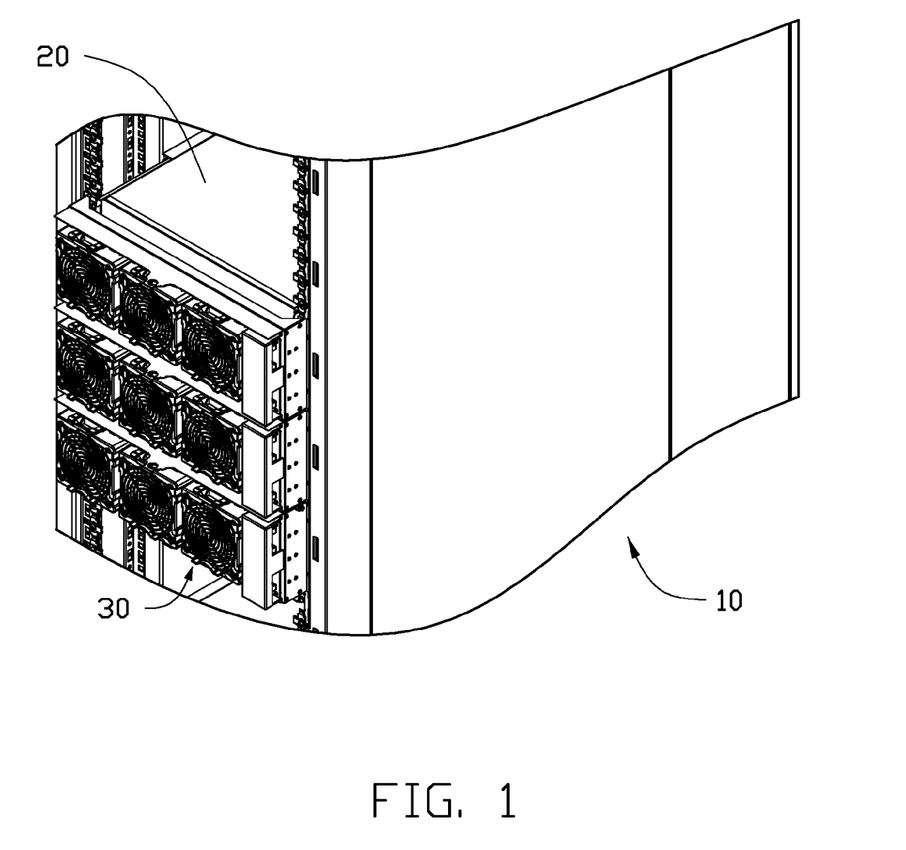
FIG. 1 is a partial, assembled, isometric view of a first embodiment of a rack-mount server system, which includes a cabinet, a plurality of server units, and a plurality of fan modules.

Referring to FIG. 1, a first embodiment of a rack-mount server system includes a cabinet 10, a plurality of server units 20 detachably mounted in the cabinet 10, and a plurality of fan modules 30 mounted to a sidewall of the cabinet 10 and aligning with the server units 20.

Figure 2:
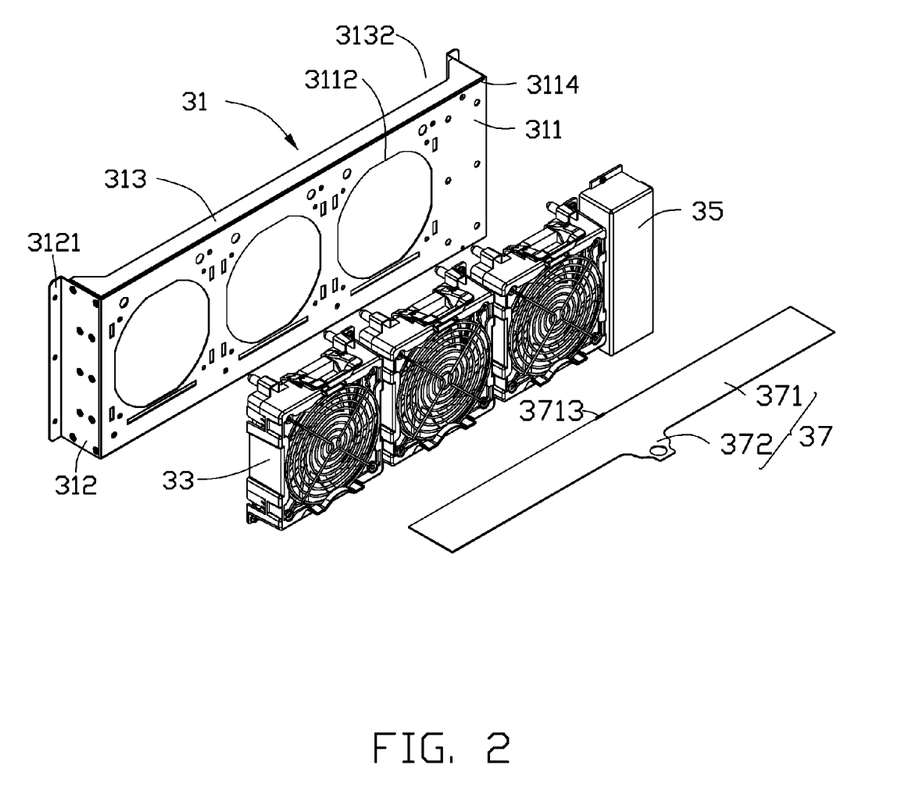
FIG. 2 is an exploded, isometric view of one of the fan modules of FIG. 1, wherein the fan module includes a mounting bracket, three fans, a control box, and an air flap.
Figure 3:
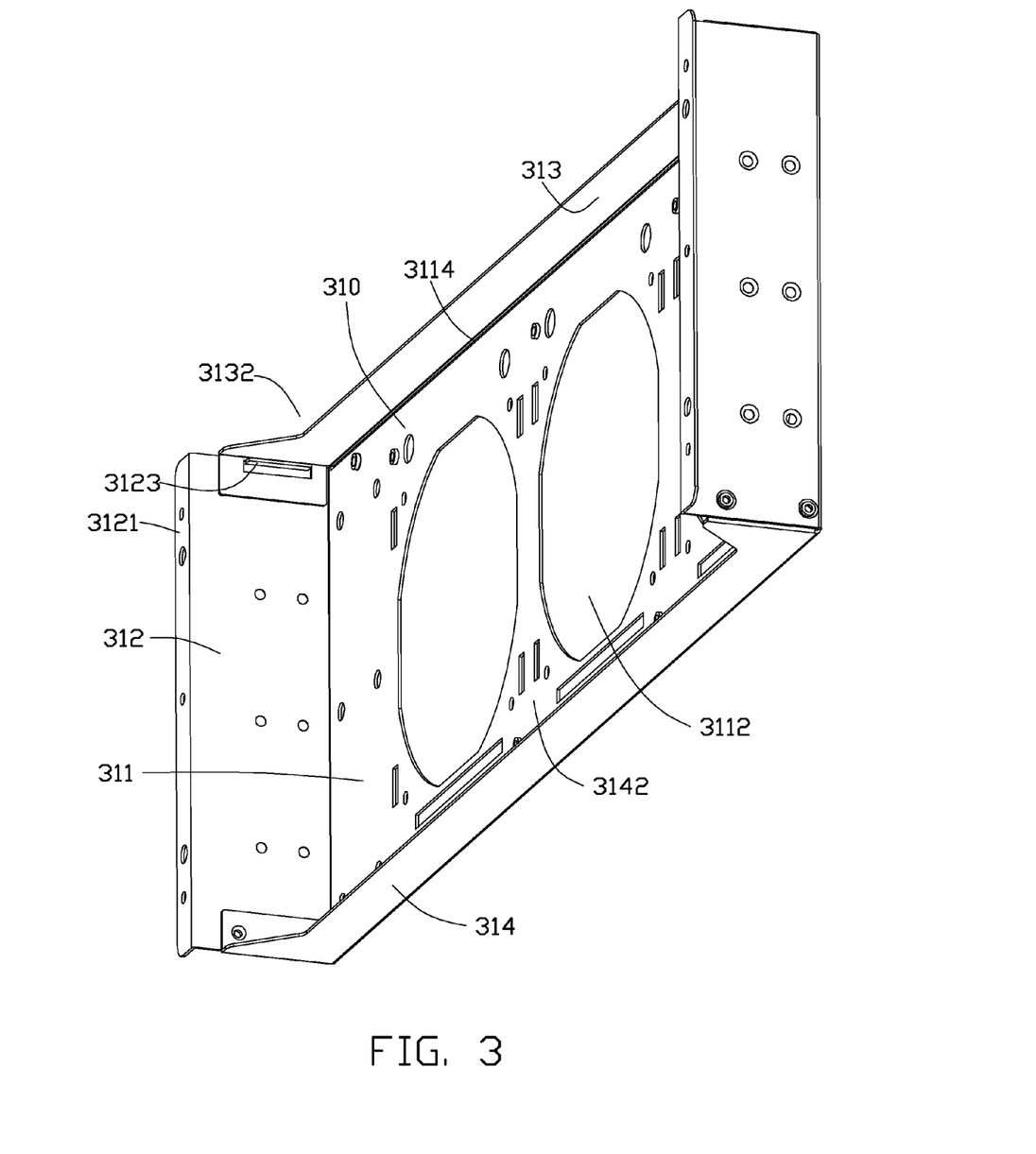
FIG. 3 shows the mounting bracket of FIG. 2 from a different perspective.

Referring to FIGS. 2 and 3, each of the fan modules 30 includes a mounting bracket 31, three fans 33, a control box 35, and an air flap 37.

The mounting bracket 31 includes a substantially rectangular mounting wall 311, two sidewalls 312, a top wall 313 and a bottom wall 314. An air passage 310 is bounded by the mounting wall 311, the sidewalls 312, the top wall 313, and the bottom wall 314. An outward flange (fixing portion 3121) perpendicularly extends out from the end of each sidewall 312 opposite to the mounting wall 311. A supporting tab 3123 extends in from each of the sidewalls 312, toward the other sidewall 312. The supporting tab 3123 is parallel to and adjacent to the top wall 313. The mounting wall 311 defines three openings 3112. The mounting wall 311 also defines a narrow slot 3114 parallel to the top wall 313 between the supporting tabs 3123 of the sidewalls 312 and the top wall 313. The top wall 313 defines a cutout 3132 arranged away from the mounting wall 311. The bottom wall 314 is similar to the top wall 313, and defines a cutout 3142. The cutouts 3132 and 3142 communicate with the air passage 310.

The air flap includes a substantially rectangular main body 371 and a manipulation portion 372 extending from a first side of the main body 371. A hook 3713 perpendicularly extends up from a second side of the main body 371 opposite to the manipulation portion 372.

Figure 4:
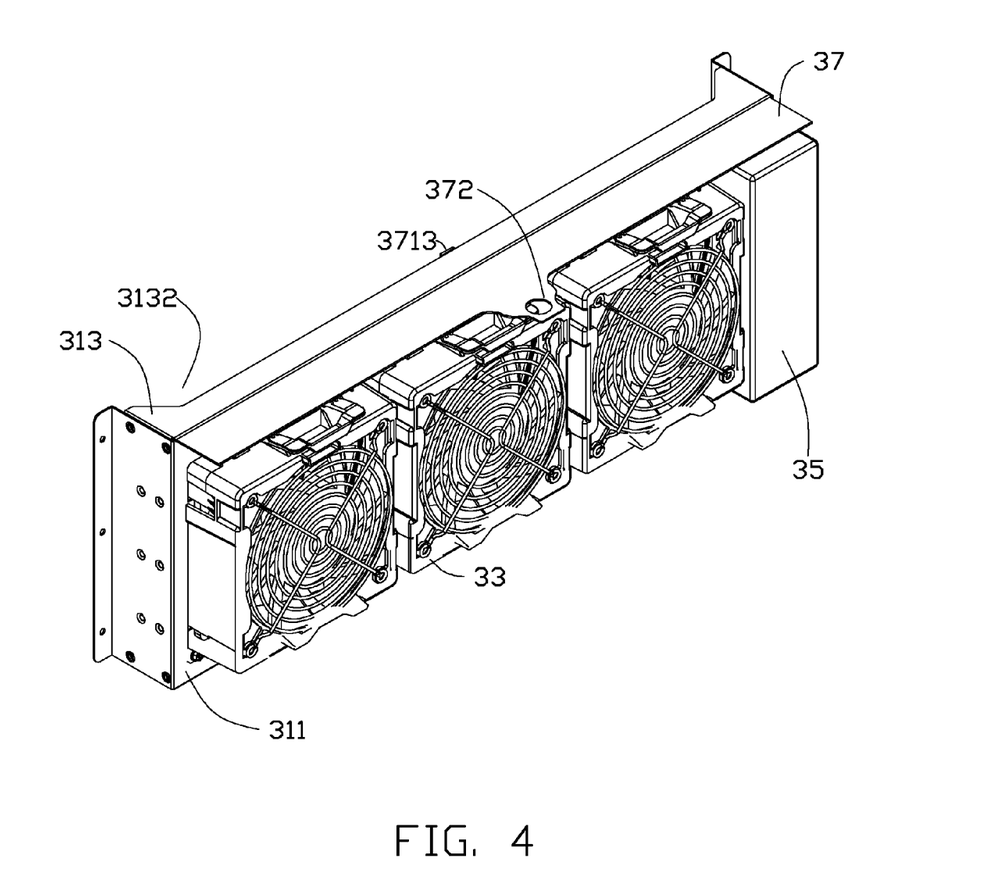
FIGS. 4 and 5 are assembled, isometric views of the mounting bracket of FIG. 2, but shown from different perspectives.
Figure 5:
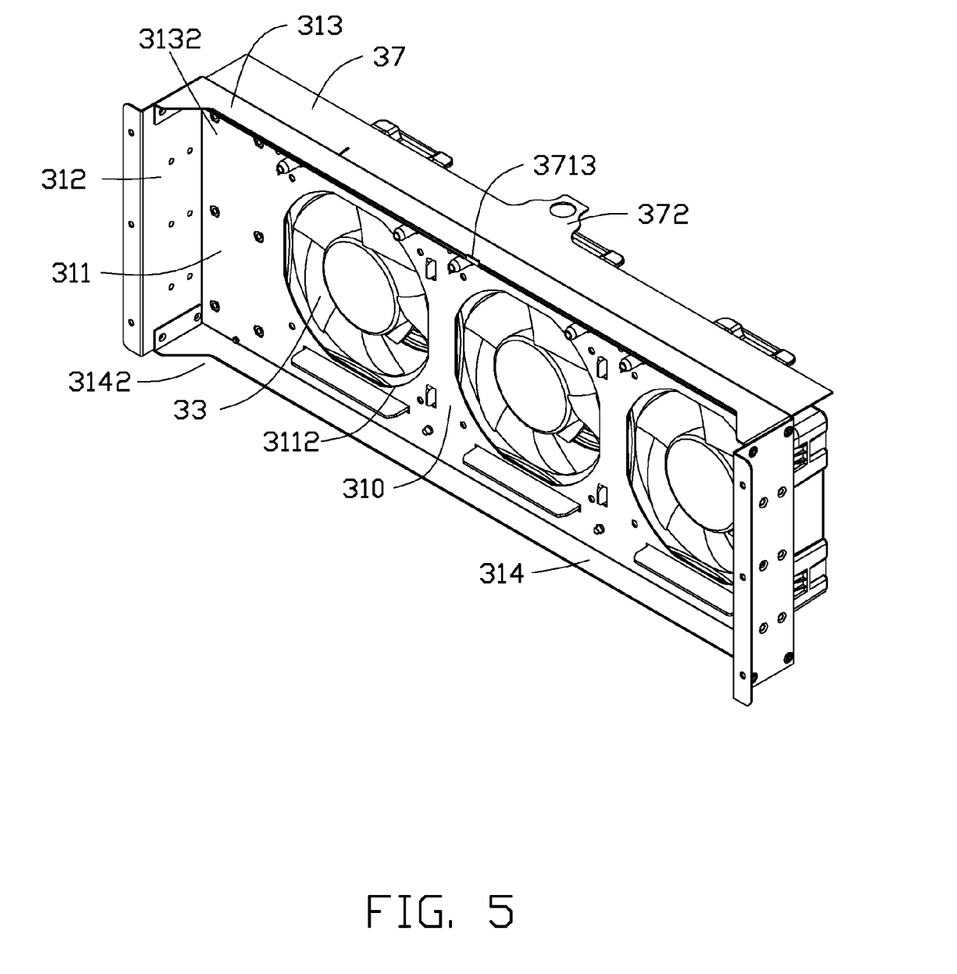

Referring to FIGS. 4 and 5, in assembling each of the fan modules 30, the fans 33 and the control box 35 are fixed to a side of the mounting wall 311 opposite to the sidewalls 312. The fans 33 align with the openings 3112. The control box 35 is electrically connected to the fans 33. The air flap 37 is slidably sandwiched between the supporting tabs 3123 and the top wall 313 along a direction parallel to the top wall 313, and engaged in the slot 3114 to extend the manipulation portion 372 out of the side of the mounting wall 311 facing the fans 33. The air flap 37 is slidable between a closed position, where the air flap 37 shields the cutout 3132 of the top wall 313, and an open position, where the cutout 3132 is exposed.

Figure 6:
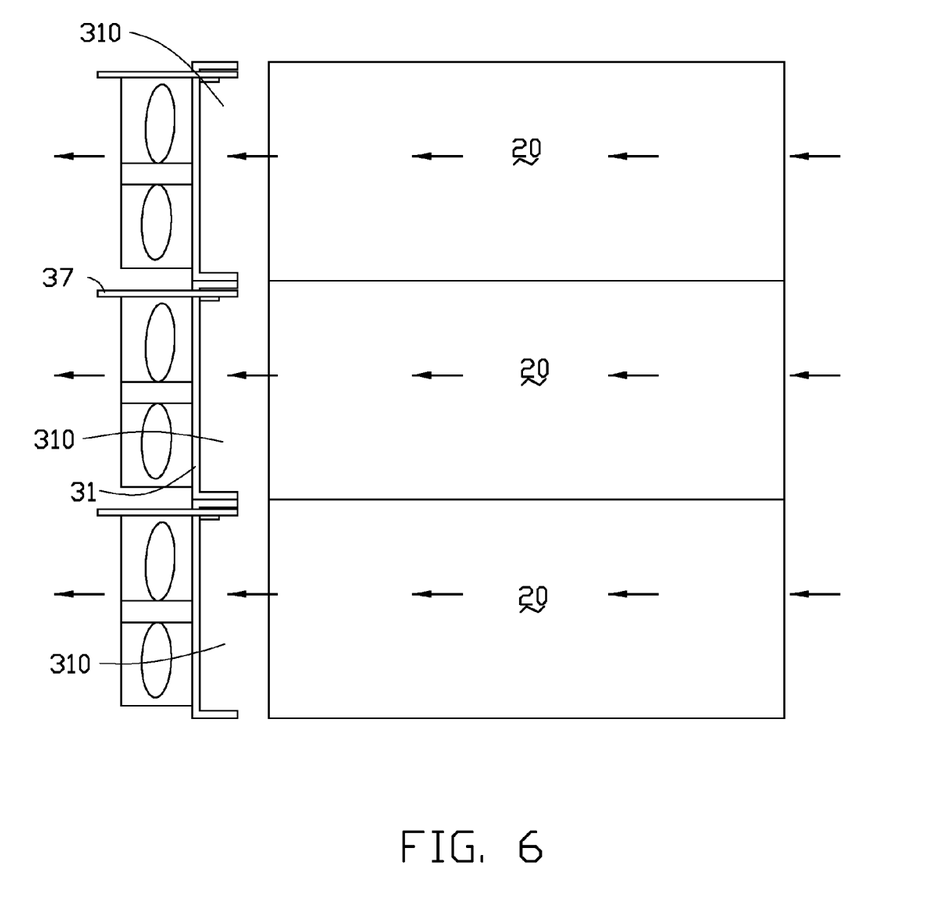
FIGS. 6 to 8 are schematic views of the rack-mount server system of FIG. 1 in different statuses.

Referring to FIGS. 1 and 6, in use, the server units 20 are mounted in the cabinet 10, the fan modules 30 are mounted to a rear wall of the cabinets 10, with the fixing portions 3121 of each of the fan modules 30 fixed to the rear wall of the cabinet 10. The air passage 310 of each of the fan modules 30 aligns with one of the server units 20. Each of the air flaps 37 can be slid to the open position with finger pressure. The fans 33 of each of the fan modules 30 produce a cooling airflow, which flows through the air passage 310 of the fan module 30 to cool one of the server units 20.

Figure 7:
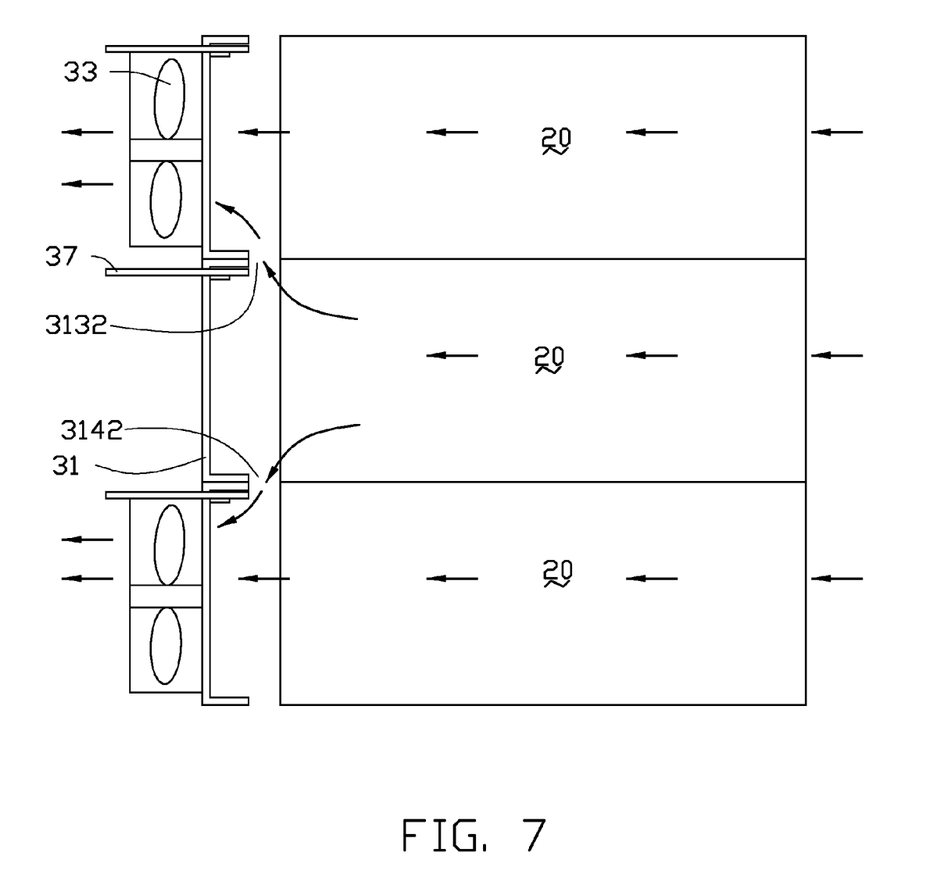

Referring to FIG. 7, the fans 33 of a fan module 30 are removed in FIG. 7 to show the failure of one of the fans 33, and in that event, by virtue of the cutouts 3132 and 3142 of the mounting bracket 31, the cooling airflow produced by the fans 33 of the neighboring fan modules 30 will be shared to the server unit 20 which was previously served by the failed fan module 30, to prevent the unserved server unit 20 from overheating.

Figure 8:
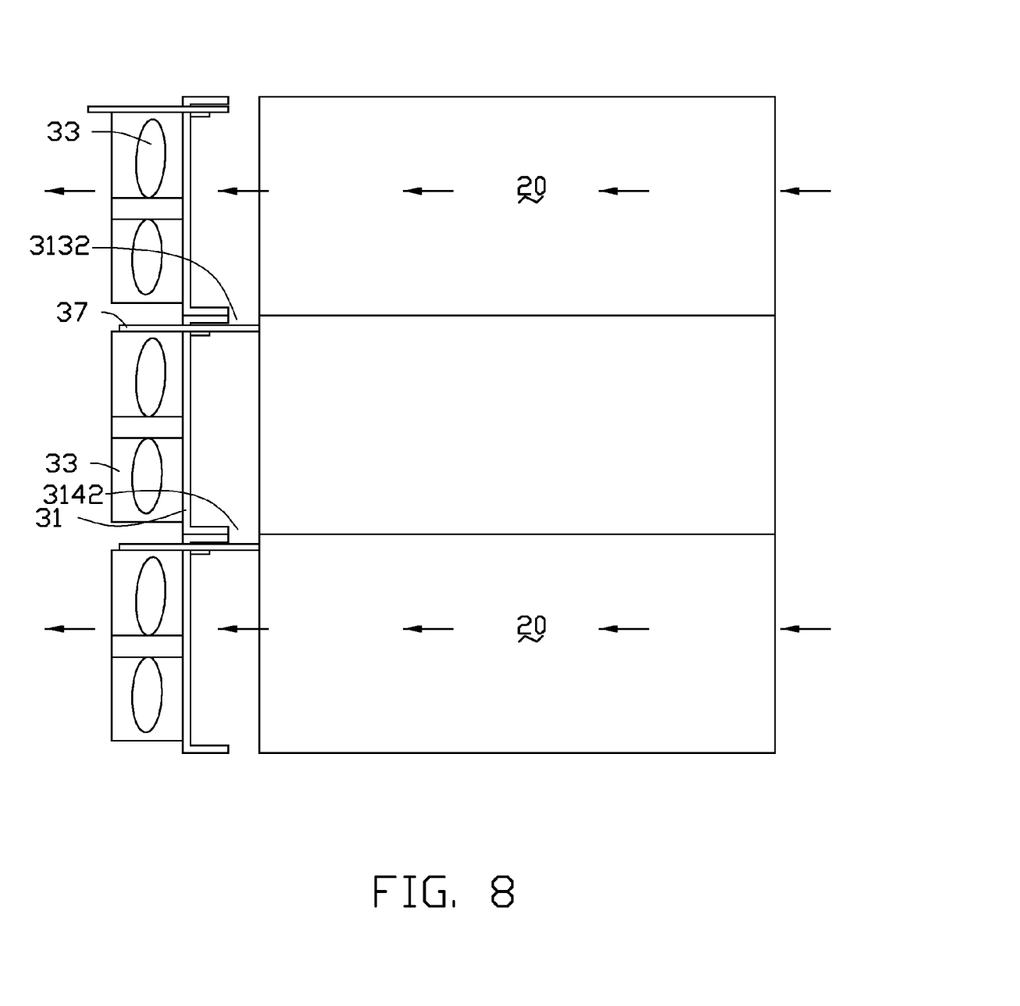

Referring to FIG. 8, when one of the server units 20 is removed from the cabinet 10, a mounting space for a server unit 20 is left empty in the cabinet 10. The fans 33 of a fan module 30 aligning with the removed server unit 20 are switched off by manipulating the control box 35. The air flaps 37 of the fan modules 30 aligning with and the directly above the switched-off fan module 30 may be slid to the closed position, to isolate the air passage 310 of the switched-off fan module 30 from the air passages 310 of the other fan modules 30. Therefore, the power to produce a cooling airflow is not wasted, since it is not allowed to flow through the empty mounting space.

Figure 9:
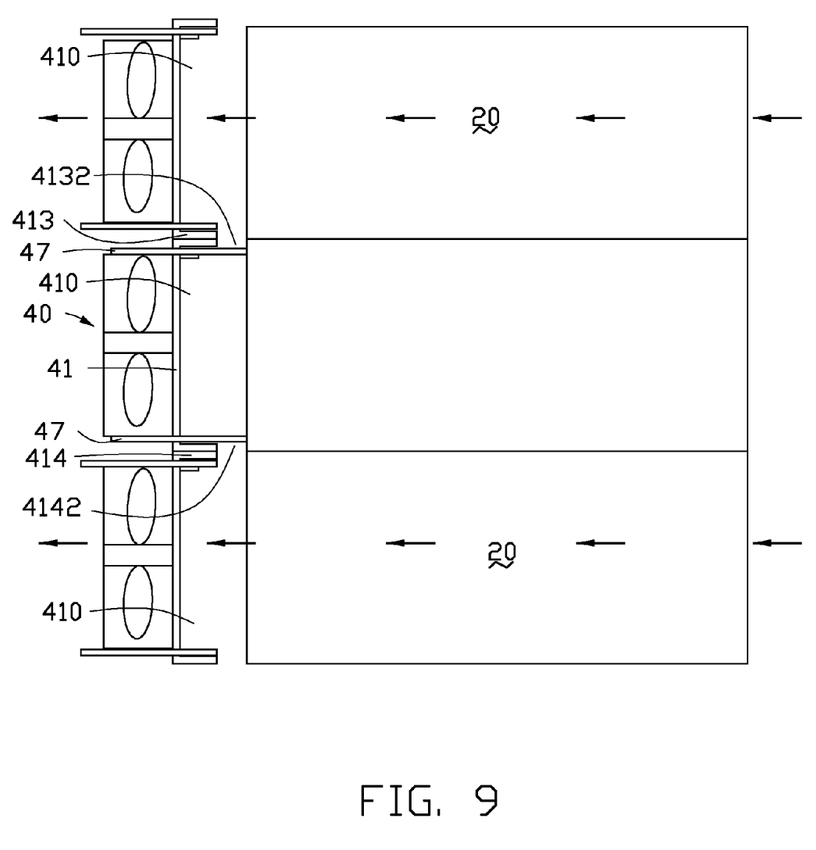
FIG. 9 is a schematic view of a second embodiment of a rack-mount server.

Referring to FIG. 9, a second embodiment of a rack-mount server system includes a plurality of fan modules 40. Each of the fan modules 40 includes a mounting bracket 41 similar to the mounting bracket 31, and two air flaps 47 similar to the air flap 37 and respectively mounted to the top and to the bottom walls 413 and 414 of the mounting bracket 41. The mounting bracket 41 defines an air passage 410. The top wall 413 defines a cutout 4132 and the bottom wall 414 defines a cutout 4142. The cutouts 4132 and 4142 communicate with the air passage 410. When one of the server units 20 is removed from the cabinet 10, both of the air flaps 47 of the fan module 40 corresponding to the removed server unit 20 may be slid to the closed position to shield the cutouts 4132 and 4142, thereby isolating the air passage 410 of one fan module 40 from the air passages 410 of the other fan modules 40.

Figure 10:
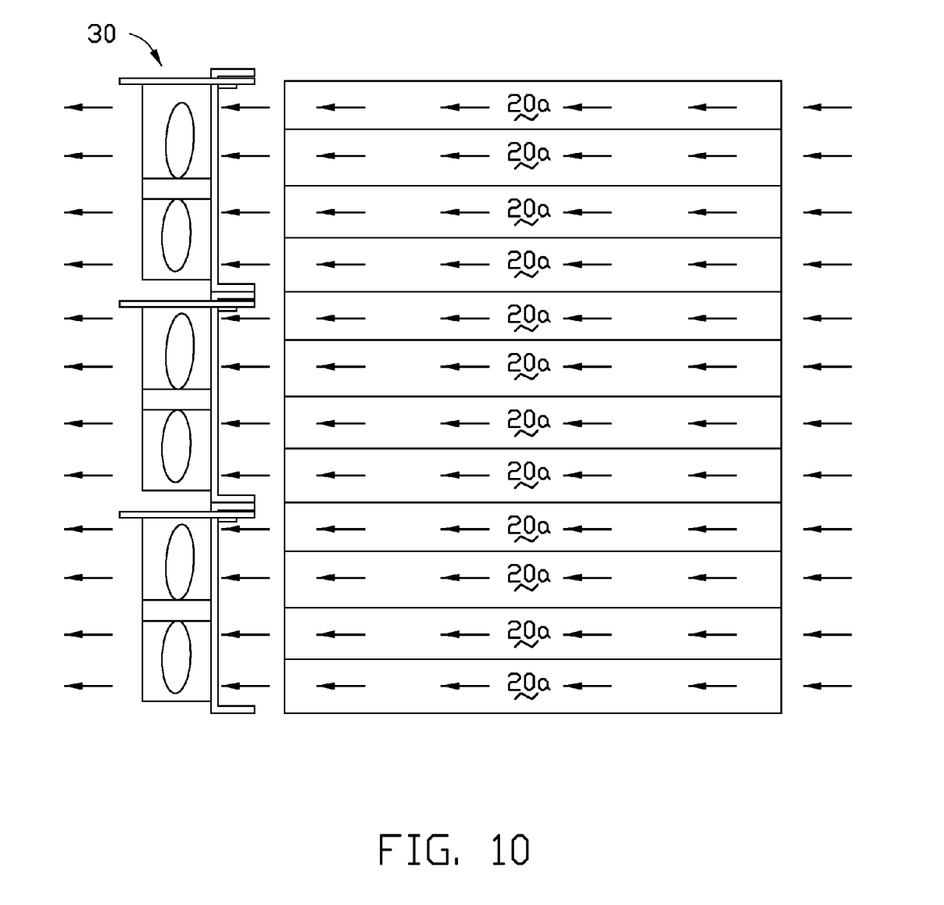
FIG. 10 is a schematic view of a third embodiment of a rack-mount server.

Referring to FIG. 10, in a third embodiment of a rack-mount server system, each of the fan modules 30 aligns with a plurality of server units 20a for heat dissipation from the server units 20a. Therefore, a fan module 30 can be switched off to save power, in case all the server units 20a which align with that fan module 30 are moved out of the cabinet 10.

It is to be understood, however, that even though numerous characteristics and advantages of the present disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A rack-mount server system comprising:
a cabinet;
a plurality of server units mounted in the cabinet; and
a plurality of fan modules attached to the cabinet, each of the fan modules comprising a mounting bracket defining an air passage aligning with one of the server units, a plurality of fans mounted to the mounting bracket to generate airflow directed to the corresponding server unit through the air passage, and at least one air flap slidably mounted to the mounting bracket;
wherein each of the mounting brackets defines at least one cutout through which the air passage of the mounting bracket communicates with the air passage of a neighboring mounting bracket, each of the at least one air flap of each mounting bracket is slidable between a closed position to shield the corresponding cutout of the mounting bracket, and an open position to expose the corresponding cutout.

2. The rack-mount server system of claim 1, wherein each mounting bracket comprises a mounting wall defining a plurality of openings, two sidewalls perpendicularly extending from opposite ends of the mounting wall toward the corresponding server unit, a top wall connected to tops of the mounting wall and sidewalls, and a bottom wall connected to bottoms of the mounting wall and sidewalls, the air passage is bounded by the mounting wall, sidewalls, top wall, and bottom wall, the fans are attached to the mounting wall and correspondingly align with the openings of the mounting wall.

3. The rack-mount server system of claim 2, wherein the at least one cutout of each mounting bracket comprises a cutout defined in the top wall of the mounting bracket.

4. The rack-mount server system of claim 3, wherein a supporting tab extends from each of the sidewalls of the mounting bracket, the supporting tabs are parallel and adjacent to the top wall of the mounting bracket, the at least one air flap of the mounting bracket comprises one air flap sandwiched between the support tabs and the top wall.

5. The rack-mount server system of claim 4, wherein the mounting wall of the mounting bracket defines a slot between the support tabs and the top wall to slidably receive the air flap.

6. The rack-mount server system of claim 5, wherein the air flap comprises a manipulation portion extending out of a side of the mounting wall opposite to the air passage.

7. The rack-mount server system of claim 2, wherein the air least one cutout comprises two cutouts respectively defined in the top and bottom walls, the at least one air flap comprises two air flaps respectively slidably mounted to the top and bottom walls corresponding to the two cutouts.

8. The rack-mount server system of claim 2, wherein a fixing portion extends from each of the sidewalls opposite to the other sidewall, and is fixed to the cabinet.

* * * * *